US010063227B2

(12) United States Patent
Bartolomeo et al.

(10) Patent No.: US 10,063,227 B2
(45) Date of Patent: Aug. 28, 2018

(54) LEVEL SHIFTING CIRCUIT

(71) Applicant: STMicroelectronics KK, Tokyo (JP)

(72) Inventors: Luca Bartolomeo, Tokyo (JP); Kazuo Eguchi, Tokyo (JP); Giuseppe Davide Bruno, Tokyo (JP)

(73) Assignee: STMicroelectronics KK, Tokyo (JP)

( * ) Notice: Subject to any disclaimer, the term of this patent is extended or adjusted under 35 U.S.C. 154(b) by 0 days.

(21) Appl. No.: 15/396,964

(22) Filed: Jan. 3, 2017

(65) Prior Publication Data
US 2018/0191341 A1    Jul. 5, 2018

(51) Int. Cl.
| H03L 5/00 | (2006.01) |
| H03K 19/0185 | (2006.01) |
| H03K 17/16 | (2006.01) |
| H01L 29/16 | (2006.01) |
| H01L 29/78 | (2006.01) |
| H03K 17/10 | (2006.01) |
| H03K 3/313 | (2006.01) |

(52) U.S. Cl.
CPC ....... *H03K 17/161* (2013.01); *H01L 29/1608* (2013.01); *H01L 29/78* (2013.01); *H03K 3/313* (2013.01); *H03K 17/102* (2013.01)

(58) Field of Classification Search
CPC .... H03K 17/161; H03K 3/313; H03K 17/102; H01L 29/1608; H01L 29/78
See application file for complete search history.

(56) References Cited

U.S. PATENT DOCUMENTS

| 4,429,205 A * | 1/1984 | Cox | H05B 6/06 219/626 |
| 5,051,613 A * | 9/1991 | Houser, Jr. | H03K 17/06 327/544 |
| 8,508,258 B2 * | 8/2013 | Ishikawa | H01L 27/0248 327/108 |
| 8,829,946 B2 * | 9/2014 | Deboy | H03K 17/166 327/108 |

OTHER PUBLICATIONS

Abbatelli, et al. "How to fine tune your SiC MOSFET gate driver to minimize losses," AN4671, STMicroelectronics, Apr. 2015.

* cited by examiner

*Primary Examiner* — Kenneth B Wells
(74) *Attorney, Agent, or Firm* — Crowe & Dunlevy

(57) ABSTRACT

A level shifting circuit has an input configured to receive an input signal, wherein the input signal has symmetrical maximum and minimum voltages. The level shifting circuit further includes an output configured to provide an output signal, wherein the output signal has asymmetrical maximum and minimum voltages. The output signal is generated in response to the input signal. The output signal is applied to drive a gate terminal of a SiC MOSFET.

22 Claims, 6 Drawing Sheets

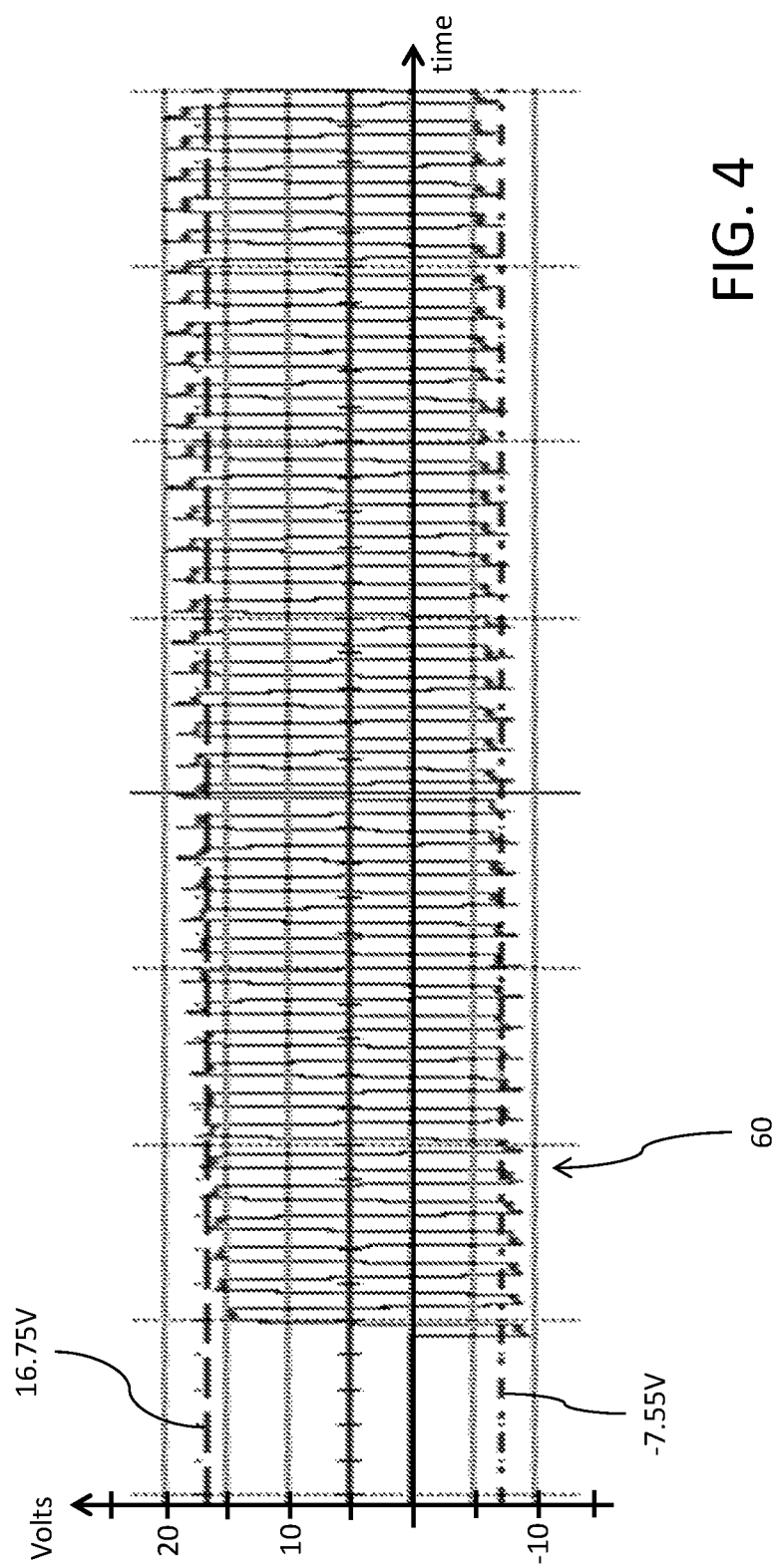

LEVEL SHIFTING CIRCUIT

TECHNICAL FIELD

The disclosure relates to an integrated circuit and, in particular, to a level shifting circuit for level shifting a control signal prior to application of the control signal to an asymmetric driver circuit.

BACKGROUND

The silicon carbide (SiC) metal oxide semiconductor field effect transistor (MOSFET) is an attractive power switch component in many power electronics applications. The advanced and innovative properties of wide band-gap SiC materials provide switching transistors that exhibit better operational properties than silicon MOSFET devices or insulated gate bipolar transistor (IGBT) devices. For example, the SiC MOSFET device has far lower switching losses than a comparable Si-based transistor switch and can operate at switching frequencies two to five times greater than a comparable Si-based transistor switch. SiC MOSFETs further exhibit very low leakage currents, and this contributes to boosting system reliability and consistency, even when subject to elevated reverse voltages or temperature increases.

It is crucial to drive the SiC MOSFET in such a way as to facilitate the lowest possible conduction and switching losses. It is noted, however, that the absolute maximum rating (AMR) sets a maximum Vgs-on and minimum Vgs-off of the SiC MOSFET that are not symmetric. For example, the maximum Vgs-on may be +25V while the minimum Vgs-off is −10V. A conventional symmetric driving circuit producing, for example, a gate drive signal having a maximum voltage of +12V and a minimum voltage of −12V cannot properly and efficiently drive the SiC MOSFET. In this example, the maximum drive signal voltage of +12V for the driving circuit produces a Vgs-on that is not high enough for the SiC MOSFET to turn on with best performance and the minimum voltage of −12V for the driving circuit produces a Vgs-off that is outside of the AMR of the SiC MOSFET.

There is a need in the art for a level shifting circuit to convert an input signal having symmetrical voltage, such as pulse transformers, to an output signal having asymmetrical voltage suited for use in driving the gate of a SiC MOSFET with the AMR requirements of the transistor device.

SUMMARY

In an embodiment, a circuit comprises: a level shifting circuit having an input configured to receive an input signal having symmetrical maximum and minimum voltages and an output configured to provide an output signal having asymmetrical maximum and minimum voltages; and a SiC MOSFET having a gate terminal driven by said output signal.

An embodiment of the level shifting circuit comprises: a capacitor coupled between the input and the output; a voltage divider circuit coupled between the input and a reference node configured to be coupled to a source terminal of the SiC MOSFET, the voltage divider circuit having a tap node; and a first diode having an anode coupled to the tap node and a cathode coupled to a terminal of the capacitor.

BRIEF DESCRIPTION OF THE DRAWINGS

For a better understanding of the embodiments, reference will now be made by way of example only to the accompanying figures in which:

FIG. 4 shows an operating waveform for the level shifting circuit of FIG. 3A or FIG. 3B;

DETAILED DESCRIPTION OF THE DRAWINGS

Figure 1A:
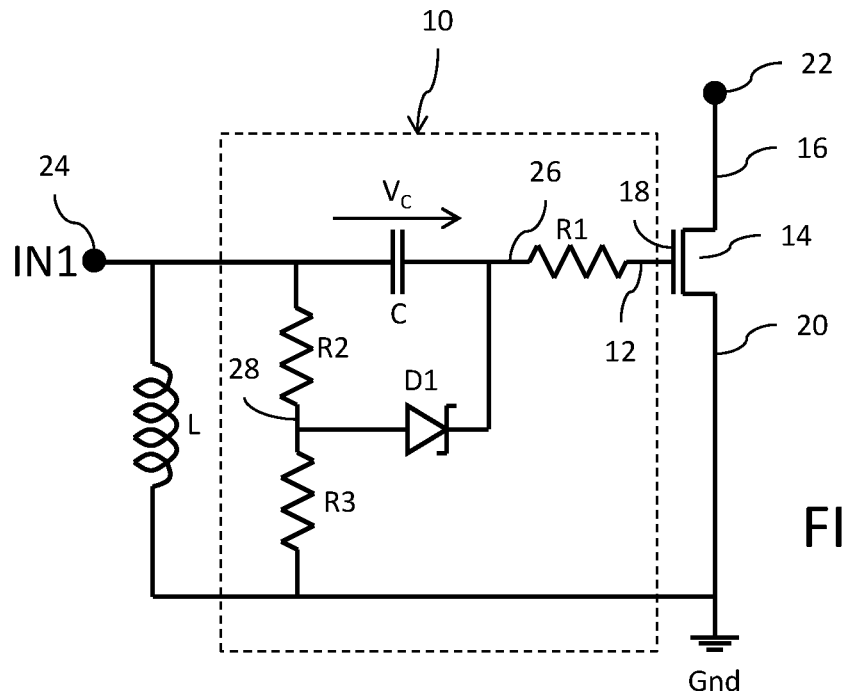
FIGS. 1A and 1B are schematic diagrams of a level shifting circuit for use in driving the gate of a SiC MOSFET with an asymmetric signal.

Reference is now made to FIG. 1A showing a schematic diagram of a level shifting circuit 10 for use in driving the gate of a SiC MOSFET 14 with an asymmetric signal. The SiC MOSFET 14 is an n-channel device having a drain terminal 16, a gate terminal 18 (coupled to an output 12 of the level shifting circuit 10) and a source terminal 20. The drain terminal 16 is configured for connection at node 22 to a circuit to be driven in a low-side driver operation. The source terminal 20 is connected to a low reference supply voltage node (ground).

The level shifting circuit 10 has an input node 24. A capacitor C has a first terminal connected to the input node 24 and a second terminal connected to an intermediate node 26. A resistor R1 has a first terminal connected to the intermediate node 26 and a second terminal connected to the output 12 and coupled to the gate terminal 18 of the SiC MOSFET 14. A resistive voltage divider is formed by resistors R2 and R3 connected in series between the input node 24 and the low reference supply voltage node. The resistor R2 has a first terminal connected to the input node 24 and a second terminal connected to a tap node 28. The resistor R3 has a first terminal connected to the tap node 28 and a second terminal connected to low reference supply voltage node. A zener diode D1 has an anode connected to the tap node 28 and a cathode connected to the intermediate node 26.

The input node 24 of the level shifting circuit 10 is configured to receive an input drive signal IN1 having symmetrical maximum and minimum voltages. The voltages of the input drive signal IN1 are considered to be symmetrical when the absolute magnitudes of the maximum voltage and minimum voltage are substantially equal (i.e., within ±1-3%). For example, the input drive signal IN1 with symmetrical voltages may have a maximum voltage of +12V and a minimum voltage or −12V and have the shape of a pulse signal (for example, a square wave or pulse width modulated (PWM) wave).

The level shifting circuit 10 is driven by a drive circuit of suitable type. In an example implementation, that drive circuit may comprise a pulse transformer circuit receiving a symmetrical signal input. The inductor L with a first terminal connected to the input node 24 and a second terminal connected to the low reference supply voltage node represents a secondary winding of that pulse transformer circuit.

As noted herein, the SiC MOSFET 14 has a maximum Vgs-on and minimum Vgs-off set by the absolute maximum rating (AMR) of the transistor device that are not symmetrical (i.e., their absolute magnitudes are not substantially equal). The level shifting circuit 10 operates to shift the symmetrical voltages of the input drive signal IN1 to generate a drive signal at the output 12 having asymmetrical voltages.

The level shifting circuit 10 works as follows:

The resistive voltage divider formed by resistors R2 and R3 fixes the voltage to be level shifted by the level shifting circuit 10. The zener diode D1 operates as a rectifier to maintain a positive polarization on the capacitor C with a voltage $V_C$ relative to the intermediate node 26 (i.e., the voltage at node 26 is maintained +$V_C$ higher than the voltage at the input node 24). The voltage $V_C$ is the level shifting voltage maintained on the capacitor C. The symmetrical voltages of the input drive signal IN1 are shifted by +$V_C$. It will be noted that for negative voltages of the input drive signal IN1, the capacitance is kept charged by the diode D.

Mathematically: $V_C=V_{IN+}*(R2/(R2+R3))-VfD1$, where $V_{IN+}$ is the maximum positive voltage of the input drive signal IN1 and VfD1 is the forward voltage of the diode D1. As an example, through proper selection of the resistances for R2 and R3, the voltage $V_C$ may be set at +8V. With an input drive signal IN1 having symmetrical voltages of a maximum voltage of +12V and a minimum voltage or −12V, the output signal generated at the output 12 and applied to the gate of the SiC MOSFET 14 would have asymmetrical voltages of a maximum voltage of +20V and a minimum voltage of −4V. These asymmetrical voltages are well within the absolute maximum rating (AMR) of the SiC MOSFET and further produce an optimum level of on-resistance when the SiC MOSFET is turned on (Vgs-on=+20V) while also permitting the SiC MOSFET device to be fully turned off (Vgs-off=−4V).

This level shifting circuit 10 presents a number of advantages: it is easily fabricated, it is inexpensive, and it has reduced power losses in comparison to prior art circuits.

It will be understood that a normal diode could be used in place of the zener diode D1. The use of a zener is, however, preferred as it makes the voltage $V_C$ immune to variations in the resistances for resistors R2 and R3.

Figure 2:
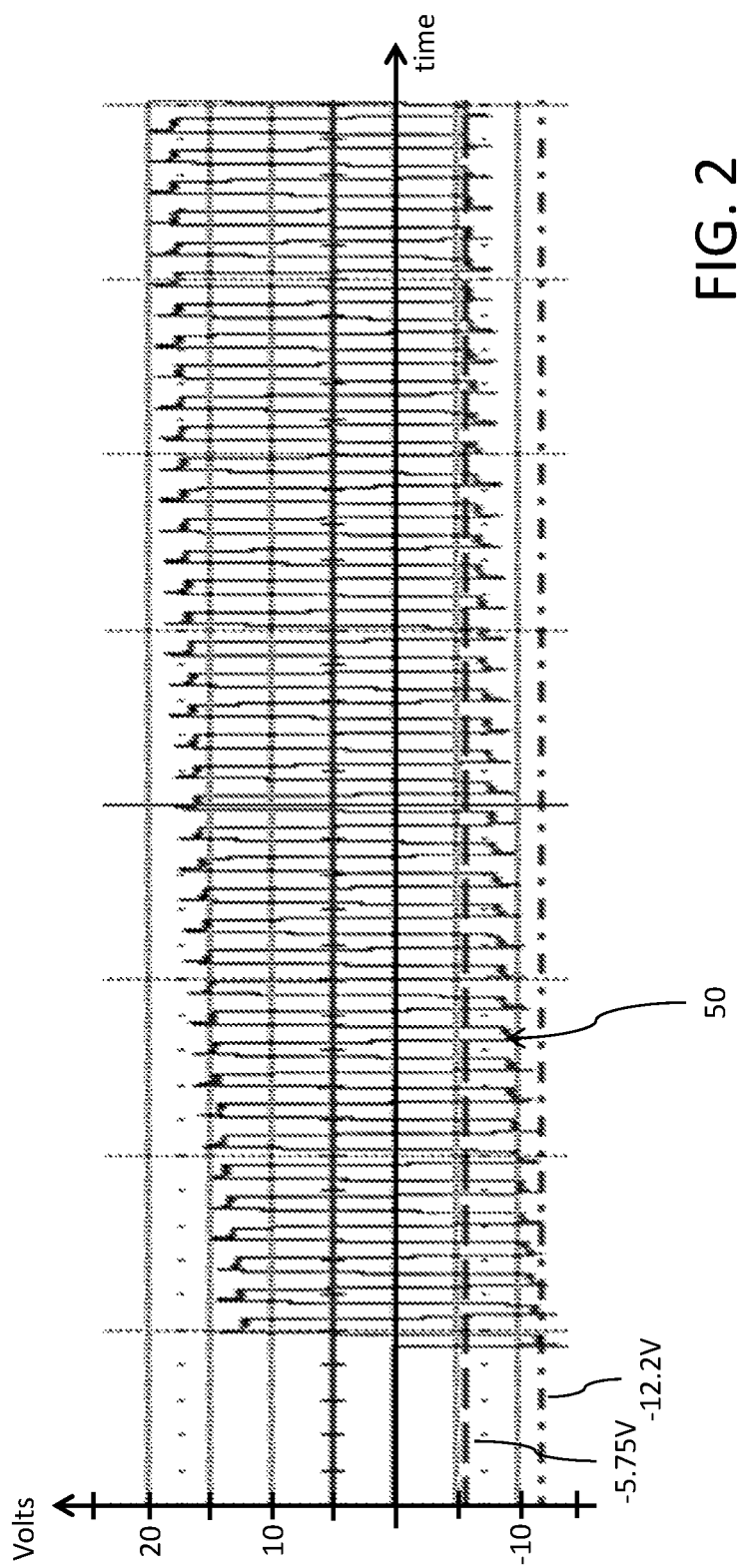
FIG. 2 shows an operating waveform for the level shifting circuit of FIG. 1A or FIG. 1B.

In operation, there is a time delay necessary to charge the capacitance of capacitor C. Thus, there is a danger at the beginning of circuit operation that the output signal generated at the output 12 in response to the input drive signal IN will have voltage values that are less than the absolute maximum rating (AMR) of the SiC MOSFET. This is shown in FIG. 2 at reference 50 where the voltage of the output signal is less than −5.75V (with a minimum value of −12.2V at the beginning of operation—this negative voltage generally being lower than the AMR of negative driving voltage for the SiC MOSFET) for a significant period of time before the capacitor C becomes sufficiently charged to level shift the signal to a range within the AMR of the transistor device.

Figure 3A:
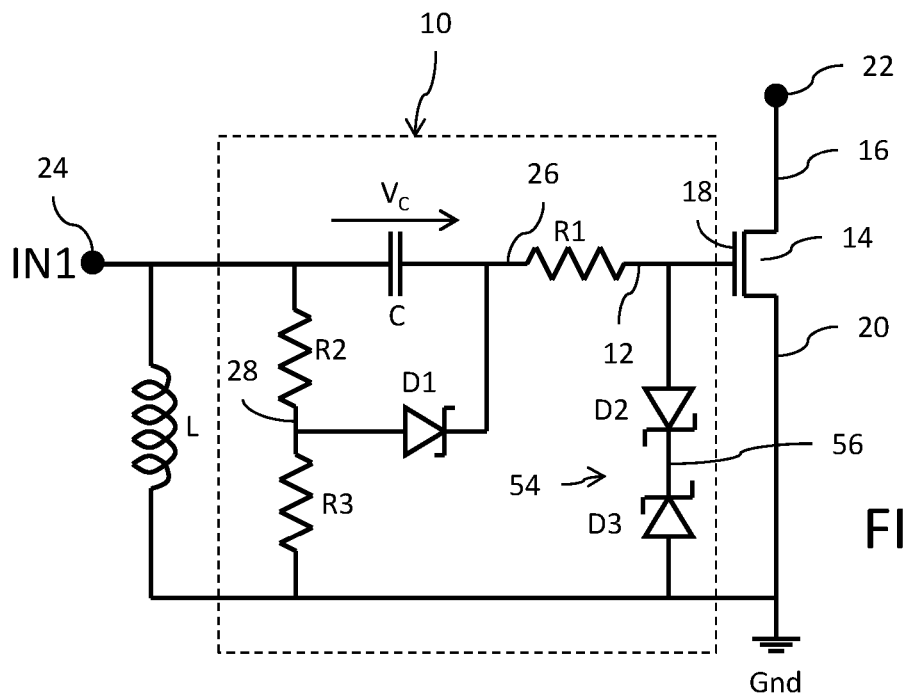
FIGS. 3A and 3B are schematic diagrams of a level shifting circuit for use in driving the gate of a SiC MOSFET with an asymmetric signal.

This problem is addressed by the addition of a gate clamping circuit 54 as shown in FIG. 3A. Same reference numbers in FIG. 3A refer to same components and parts in FIG. 1A, and will not be further described. The gate clamping circuit 54 comprises a zener diode D2 having an anode connected to the gate terminal of the SiC MOSFET 14 and a cathode connected to an intermediate node 56. The gate clamping circuit 54 further comprises a zener diode D3 having a cathode connected to the intermediate node 56 and an anode connected to the source terminal of the SiC MOSFET 14. The diode D3 could, in some embodiments, be implemented using two or more series connected devices dependent on the breakdown voltage.

The diode D2 is used to clamp the negative voltage level of the Vgs of the SiC MOSFET 14. The diode D2 should accordingly be selected to have a breakdown voltage that is less than the absolute magnitude of the minimum Vgs-off value satisfying the absolute maximum rating (AMR) of the transistor and larger than the Vgs-off of the clamping circuit, in order to be activated only at the beginning of operation when the capacitor C is charging. Mathematically: Vgs-off<VbrD2<AMR−VfD3, where VbrD2 is the breakdown voltage of diode D2 and VfD3 is the forward voltage of diode D3. The diode D3 is used to block current flow during transistor turn on. The diode D3 should accordingly be selected to have a breakdown voltage that is greater than the Vgs-on of the SiC MOSFET 14. Preferably the breakdown voltage of the diode D3 is less than the maximum Vgs-on specified by the absolute maximum rating (AMR) of the transistor. A zener diode is used for diode D3 in order to control the breakdown voltage in a more accurate manner. The diode D3, in some embodiments, could be implemented using two or more series connected devices dependent on the desired breakdown voltage.

The beneficial effect of the gate clamping circuit 54 is shown in FIG. 4 at reference 60. Compared to FIG. 2, it is noted that the clamping of the negative voltage serves to prevent the gate drive signal voltage from falling below the minimum Vgs-off value which would violate the absolute maximum rating (AMR) of the transistor.

The resistance of resistor R1 is selected to balance between power loss and switching loss. A larger resistance reduces power loss on the clamping diode, while a smaller resistance reduces switching losses (especially at high frequency).

Figure 1B:
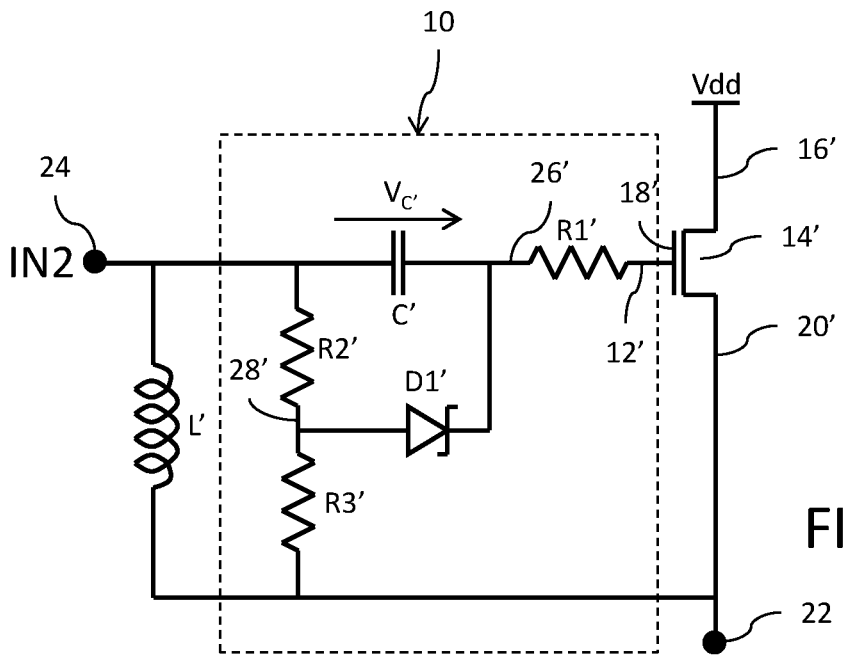
Figure 3B:
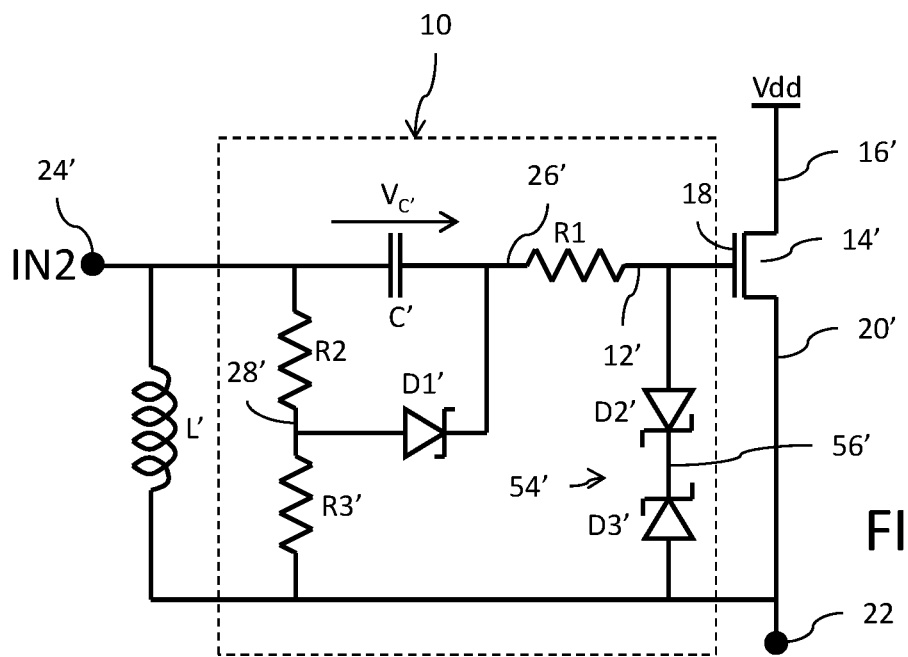

The level shifting circuits 10 of FIGS. 1A and 3A are illustrated for use in connection with low side SiC MOSFET driver circuits. It will be understood, however, that the same circuit configuration can be used in a high side driver application as shown in FIGS. 1B and 3B (where the prime (') designation is added to the reference numbers for like or similar components as described above). The node 22 could also represent a common output in a half-bridge circuit configuration using both the high side circuit and low side circuit. The level shifter for the high side circuit receives an input drive signal IN2. In the half-bridge configuration, that input drive signal IN2 would be 180° out of phase with respect to the input drive signal IN1, and furthermore the signals IN1 and IN2 may be configured to be non-overlapping signals in order to preclude shoot-through operation of the SiC MOSFETs 14 and 14'.

Figure 5:
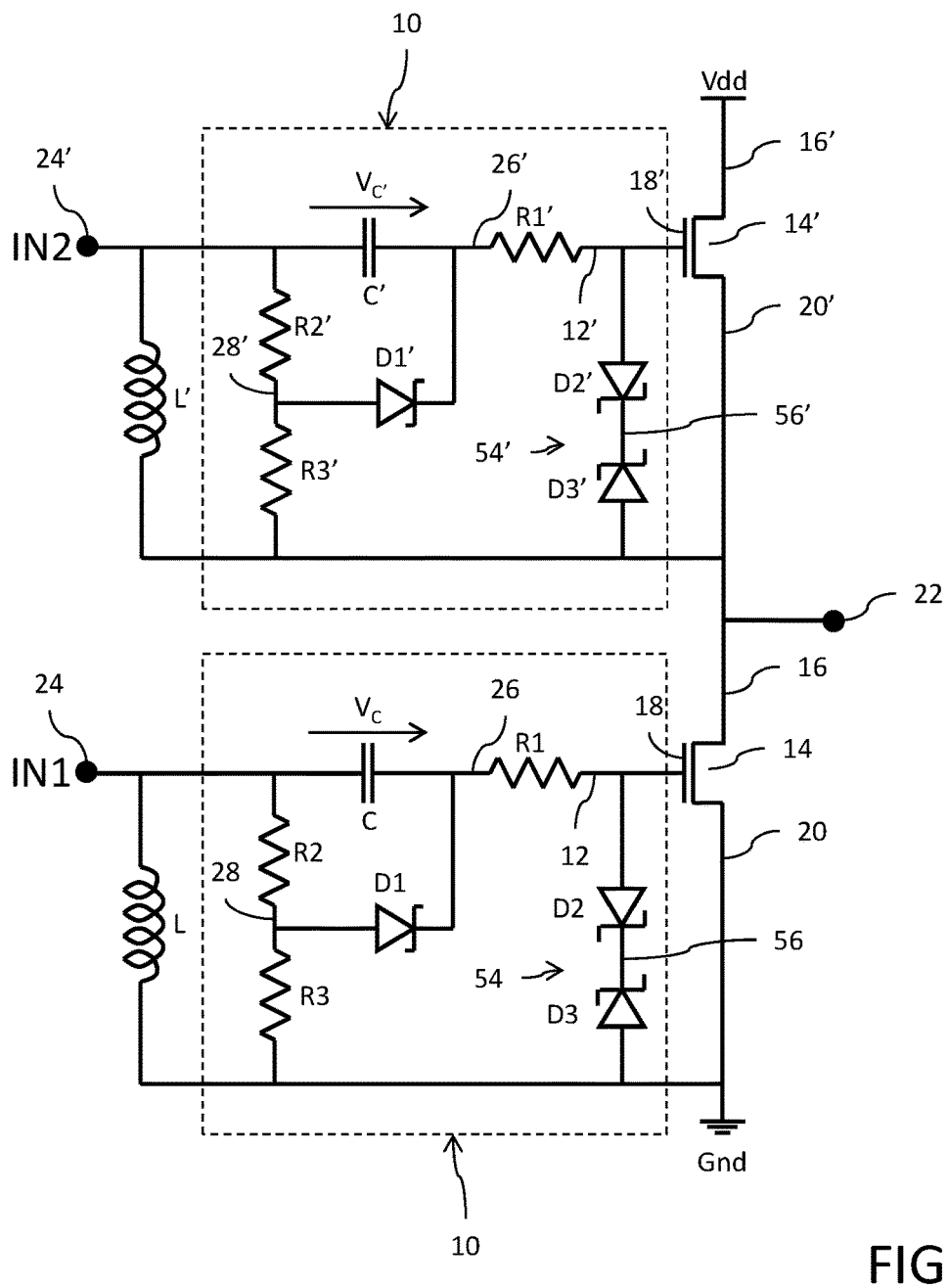
FIG. 5 is a schematic diagram of a half-bridge driver circuit with level shifting circuits driving the gates of high side and low side SiC MOSFETs.
Figure 6:
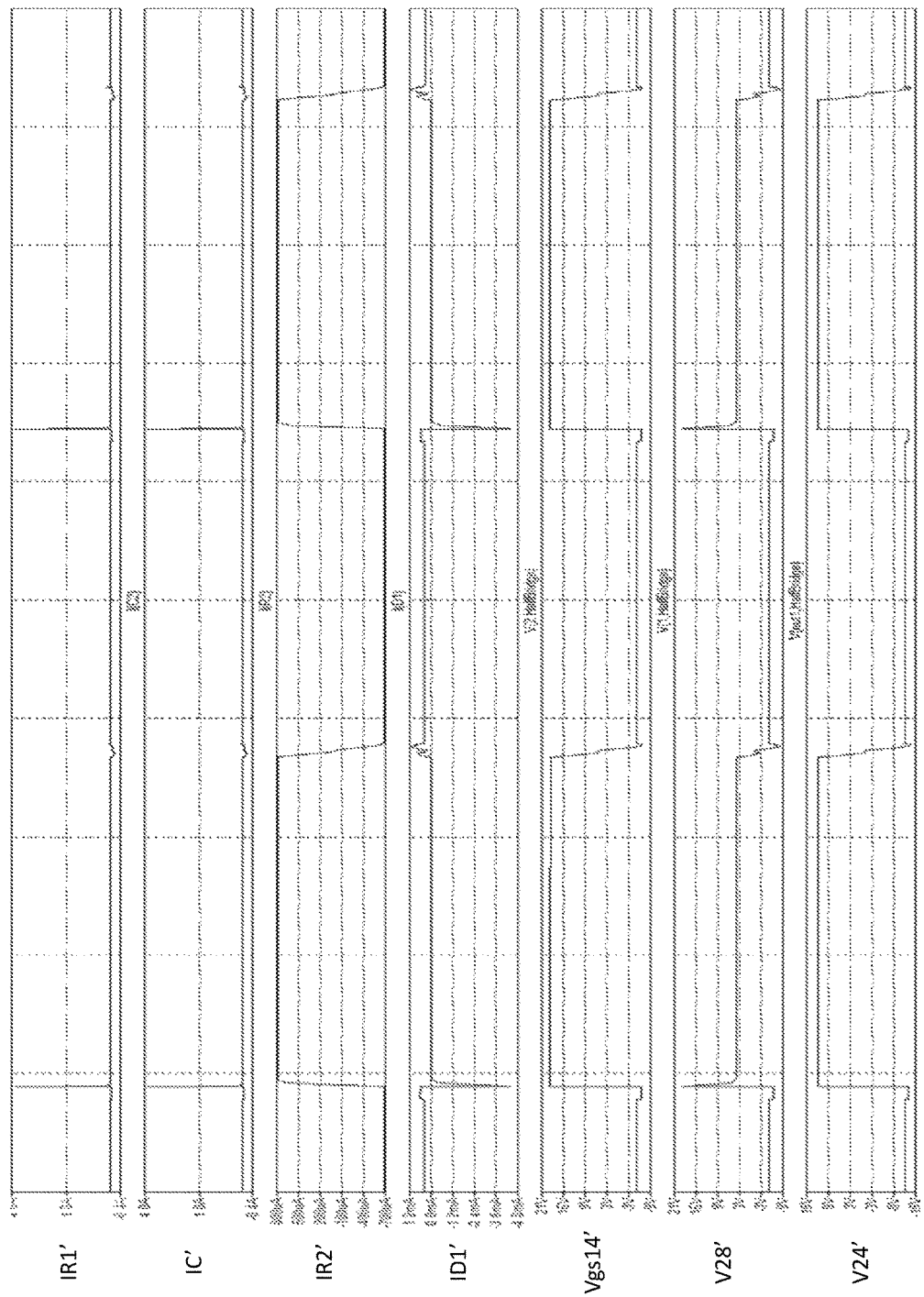
FIG. 6 shows an operating waveform for the circuit of FIG. 5.

A circuit diagram for the half-bridge circuit is shown in FIG. 5. Operational waveforms for high side of the circuit of FIG. 5 are shown in FIG. 6. In this context: IR1' is the current through resistor R1'; IC' is the current through capacitor C', IR2' is the current through resistor R2', ID1' is the current through diode D1', Vgs14' is the gate drive voltage of SiC MOSFET 14' at node 12 (referred to node 22 such that it represents the actual gate to source voltage), V28' is the voltage at the tap node 28' of the voltage divider, and V24' is the input voltage IN2 at node 24' (referred to node 22). Similar waveforms apply to operation of the low side of the circuit of FIG. 5.

The foregoing description has provided by way of exemplary and non-limiting examples a full and informative description of the exemplary embodiment of this invention. However, various modifications and adaptations may become apparent to those skilled in the relevant arts in view of the foregoing description, when read in conjunction with the accompanying drawings and the appended claims. However, all such and similar modifications of the teachings of this invention will still fall within the scope of this invention as defined in the appended claims.

What is claimed is:

1. A circuit, comprising:
    an input node configured to receive a symmetrical drive input signal;
    an output node configured to be coupled to a gate terminal of a SiC MOSFET and output an asymmetrical gate drive signal;
    a capacitor coupled between the input node and the output node;
    a voltage divider circuit directly connected between the input node and a reference node configured to be coupled to a source terminal of the SiC MOSFET, the voltage divider circuit having a tap node; and
    a first diode having an anode coupled to the tap node and a cathode coupled to a terminal of the capacitor.

2. The circuit of claim 1, wherein a further terminal of the capacitor is connected to the input node and said terminal of the capacitor is connected to an intermediate node, and wherein the cathode of the first diode is connected to the intermediate node.

3. The circuit of claim 2, further comprising a resistor coupled between the intermediate node and the output node.

4. The circuit of claim 3, wherein a first terminal of the resistor is connected to the intermediate node and a second terminal of the resistor is connected to the output node.

5. The circuit of claim 1, wherein the anode of the first diode is connected to the tap node and the cathode of the first diode is connected to the terminal of the capacitor.

6. The circuit of claim 1, further comprising a gate clamping circuit coupled between the output node and the reference node, said gate clamping circuit configured to clamp a gate to source voltage of the SiC MOSFET.

7. The circuit of claim 6, wherein the gate clamping circuit comprises:
    a second diode coupled between the output node and a further intermediate node; and
    a third diode coupled between the further intermediate node and the reference node;
    wherein anodes of the first and second diodes are connected to each other.

8. The circuit of claim 1, wherein the symmetrical drive input signal has symmetrical maximum and minimum voltages of +V and −V, respectively, wherein the asymmetrical gate drive signal has asymmetrical maximum and minimum voltages of +V+Vc and −V+Vc, respectively, and wherein Vc is a voltage stored across said capacitor.

9. A circuit, comprising:
    a level shifting circuit configured to provide a voltage shift of Vc and having an input configured to receive an input signal having symmetrical maximum and minimum voltages of +V and −V, respectively, and an output configured to provide an output signal having asymmetrical maximum and minimum voltages of +V+Vc and −V+Vc, respectively; and
    a SiC MOSFET having a gate terminal driven by said output signal.

10. The circuit of claim 9, wherein the level shifting circuit comprises:
    a capacitor coupled between the input and the output;
    a voltage divider circuit coupled between the input and a reference node configured to be coupled to a source terminal of the SiC MOSFET, the voltage divider circuit having a tap node; and
    a first diode having an anode coupled to the tap node and a cathode coupled to a terminal of the capacitor.

11. The circuit of claim 10, wherein a further terminal of the capacitor is connected to the input and said terminal of the capacitor is connected to an intermediate node, and wherein the cathode of the first diode is connected to the intermediate node.

12. The circuit of claim 11, further comprising a resistor coupled between the intermediate node and the output.

13. The circuit of claim 12, wherein a first terminal of the resistor is connected to the intermediate node and a second terminal of the resistor is connected to the output.

14. The circuit of claim 10, wherein the anode of the first diode is connected to the tap node and the cathode of the first diode is connected to the terminal of the capacitor.

15. The circuit of claim 10, further comprising a gate clamping circuit coupled between the output and the reference node, said gate clamping circuit configured to clamp a gate to source voltage of the SiC MOSFET.

16. The circuit of claim 15, wherein the gate clamping circuit comprises:
    a second diode coupled between the output and a further intermediate node; and
    a third diode coupled between the further intermediate node and the reference node;
    wherein anodes of the first and second diodes are connected to each other.

17. The circuit of claim 10, wherein Vc is a voltage stored across said capacitor.

18. A circuit, comprising:
    an input node configured to receive a symmetrical drive input signal;
    a output node configured to be coupled to a gate terminal of a SiC MOSFET and output an asymmetrical gate drive signal;
    a capacitor having a first terminal directly connected to the input node and a second terminal directly connected to an intermediate node which is coupled to the output node;
    a voltage divider circuit comprising first and second resistors coupled in series wherein a terminal of the first resistor is directly connected to the input node and a terminal of the second resistor is directly connected to a reference node which is configured to be coupled to a source terminal of the SiC MOSFET, the voltage divider circuit having a tap node; and
    a first diode having an anode directly connected to the tap node and a cathode directly connected to the intermediate node.

19. The circuit of claim 18, further comprising a third resistor coupled between the intermediate node and the output node.

20. The circuit of claim 18, further comprising a gate clamping circuit coupled between the output node and the reference node, said gate clamping circuit configured to clamp a gate to source voltage of the SiC MOSFET.

21. The circuit of claim 20, wherein the gate clamping circuit comprises:
    a second diode coupled between the output node and a further intermediate node; and
    a third diode coupled between the further intermediate node and the reference node;
    wherein anodes of the first and second diodes are connected to each other.

22. The circuit of claim 18, wherein the symmetrical drive input signal has symmetrical maximum and minimum voltages of +V and −V, respectively, wherein the asymmetrical gate drive signal has asymmetrical maximum and minimum voltages of +V+Vc and −V+Vc, respectively, and wherein Vc is a voltage stored across said capacitor.

\* \* \* \* \*